United States Patent [19]
Ohno et al.

[11] Patent Number: 5,736,753
[45] Date of Patent: Apr. 7, 1998

[54] SEMICONDUCTOR DEVICE FOR IMPROVED POWER CONVERSION HAVING A HEXAGONAL-SYSTEM SINGLE-CRYSTAL SILICON CARBIDE

[75] Inventors: Toshiyuki Ohno, Hitachi; Yohsuke Inoue, Tokai-mura; Daisuke Kawase, Hitachi; Yuzo Kozono, Hitachioota; Takaya Suzuki, Hitachinaka; Tsutomu Yatsuo, Hitachi, all of Japan

[73] Assignee: Hitachi, Ltd., Tokyo, Japan

[21] Appl. No.: 521,548

[22] Filed: Aug. 30, 1995

[30] Foreign Application Priority Data

Sep. 12, 1994 [JP] Japan .................................. 6-216930

[51] Int. Cl.$^6$ ...................... H01L 31/0312; H01L 29/74; H01L 29/861
[52] U.S. Cl. .................. 257/77; 257/628; 257/147; 257/481
[58] Field of Search ................. 257/77, 628, 54, 257/527

[56] References Cited

U.S. PATENT DOCUMENTS 5,585,648  12/1996  Tischler .................. 257/94

Primary Examiner—Wael Fahmy
Attorney, Agent, or Firm—Bardehle, Pagenberg, Dost, Altenburg, Frohwitter, Geissler

[57] ABSTRACT

To provide a field-effect transistor having a large power conversion capacity and its fabrication method by decreasing the leakage current between the source and the drain of a semiconductor device made of hexagonal-system silicon carbide when the gate voltage of the semiconductor device is turned off and also decreasing the electrical resistance of the semiconductor device when the gate voltage of the semiconductor device is turned on. The main current path of the field-effect transistor is formed so that the current flowing between the source and the drain of, for example, a field-effect transistor flows in the direction parallel with the {0001} plane and a channel forming plane is parallel with the {1120} plane. [Selected Drawing]FIG. 1

14 Claims, 11 Drawing Sheets

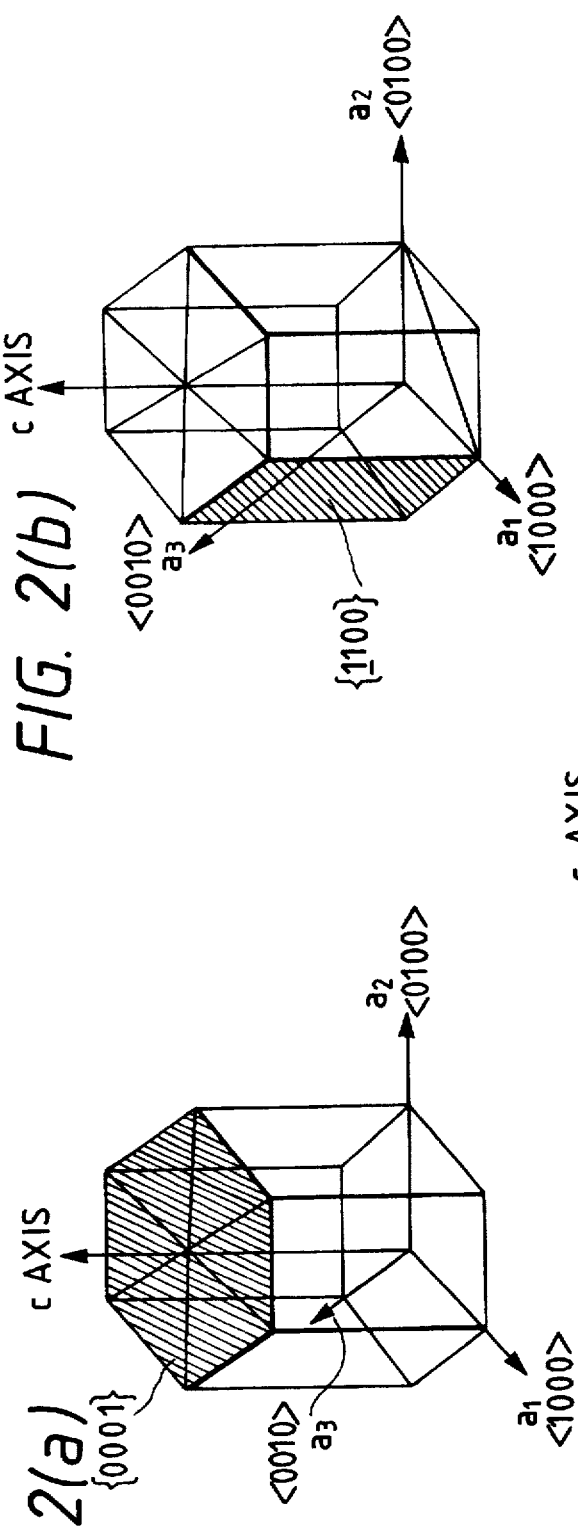
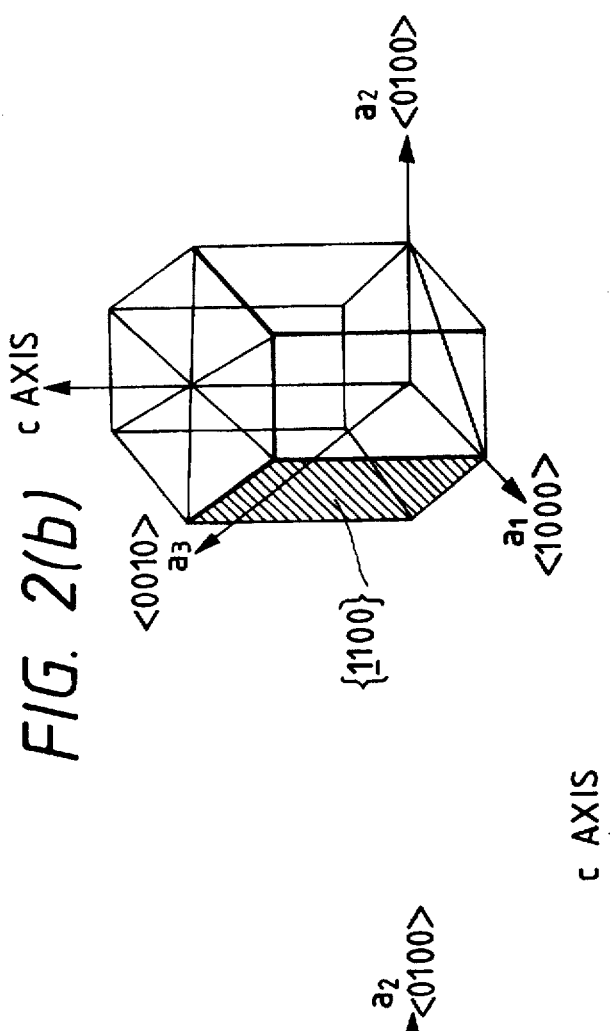
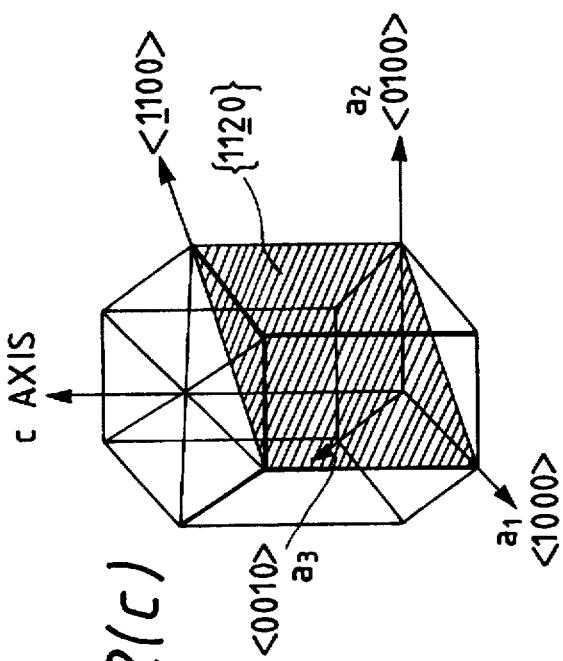
FIG. 2(a)
FIG. 2(b)
FIG. 2(c)

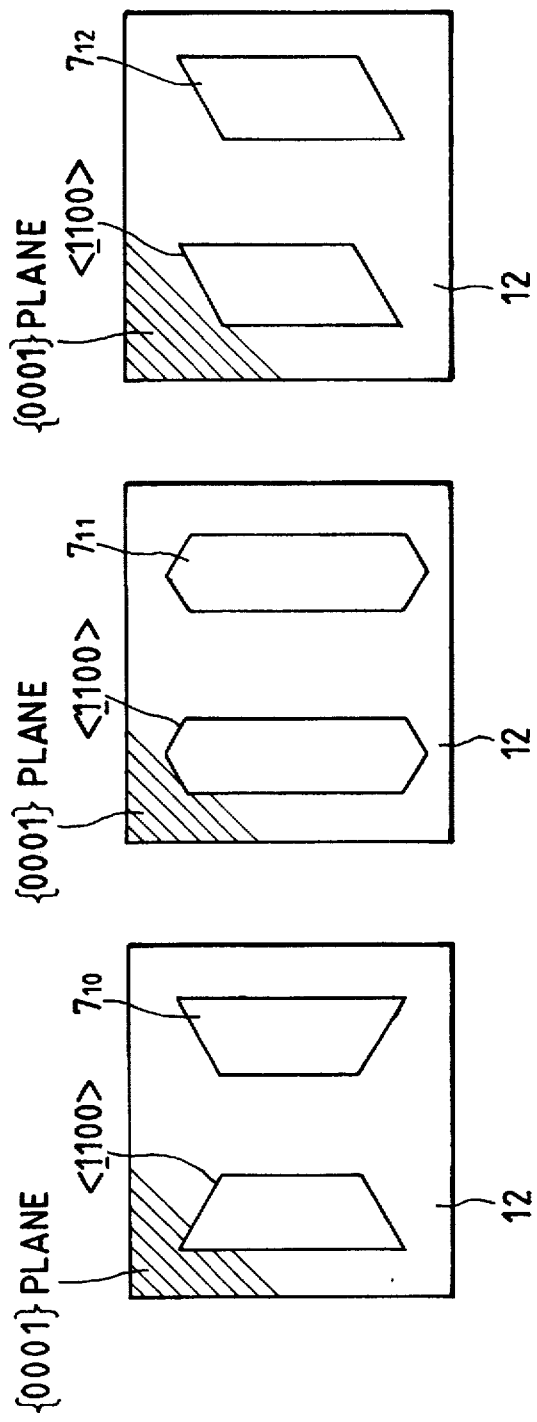

SEMICONDUCTOR DEVICE FOR IMPROVED POWER CONVERSION HAVING A HEXAGONAL-SYSTEM SINGLE-CRYSTAL SILICON CARBIDE

BACKGROUND THE INVENTION

The present invention relates to a semiconductor device such as a field-effect transistor using hexagonal-system silicon carbide (SIC) and to a fabrication method of the semiconductor device. Particularly, a specific crystal plane of hexagonal-system single-crystal silicon carbide is parallel with the path of controlled current and moreover a specific plane of the single crystal serves as a channel forming plane and a fabrication method of the semiconductor device.

DESCRIPTION OF RELATED ART

To fabricate discrete power semiconductor devices and discrete power integrated circuit (IC) in the prior art, a single-crystal wafer made of silicon (Si) or gallium arsenide (GaAs) is mainly used. It is known that single-crystal silicon or gallium arsenide has a cubic-system crystal structure. The operating voltage and operating current of the discrete power semiconductor device have recently been increased and moreover, the operating frequency tends to rise more and more. Also for the discrete power integrated circuit, the operating conditions become severer and therefore, a high reliability has been required for operations under a high temperature state and under a radiation exposure state. In the case of a semiconductor device using a single-crystal wafer of silicon or gallium arsenide, however, there have been limits of removing heat dissipated from a device or increasing the operating frequency.

To break these limits, single-crystal silicon carbide with a large energy band gap has recently been noticed as a material of a semiconductor device. That is, because the silicon carbide has a large energy band gap compared to silicon, it also has a large dielectric breakdown strength. Therefore, when a small semiconductor device is formed from the single-crystal silicon carbide, high-voltage large-current operation is possible. Moreover, because the single-crystal silicon carbide has a large energy band gap, it has a possibility that the operating temperature of a semiconductor device can theoretically be raised hundreds of degrees or higher than that of a semiconductor device made of silicon. Furthermore, it is expected that the semiconductor device made of the single-crystal silicon carbide shows characteristics superior to the semiconductor device made of silicon even at a high frequency, high voltage, and large current because of the optimization design of a semiconductor device.

Single-crystal silicon carbide may have either a cubic-system structure the same as silicon and gallium arsenide or a hexagonal-system structure. It is known that the single crystal having the hexagonal-system structure is superior to the single crystal having the cubic-system structure in such characteristics as band gap and dielectric breakdown strength.

Therefore, silicon carbide is superior to silicon and gallium arsenide in various characteristics. However, it has been considered so far that it is very difficult to obtain silicon carbide of purity necessary for fabricating a semiconductor device and manufacture single-crystal silicon carbide in bulk size necessary for forming the semiconductor device. Therefore, a power semiconductor device fabricated by using silicon carbide has not greatly been researched or developed.

However, a technique has been developed very recently which makes it possible to manufacture single-crystal silicon carbide with a relatively high purity and a large size necessary for fabricating a semiconductor device at a relatively high efficiency. Therefore, the development of a semiconductor device using silicon carbide has positively been promoted. An example of the above is the field-effect transistor disclosed in the official gazette of Japanese Patent Laid-Open No. 239778/1992.

FIG. 13 is a block diagram of a field-effect transistor fabricated with single-crystal silicon carbide disclosed in the above official gazette.

In FIGS. 13(a) and 13(b), numeral 51 represents an n-type ($n^+$-type) layer with a low resistivity, 52 represents an n-type ($n^-$-type) drain layer with a high resistivity, 53 represents a p-type well layer, 54 represents an n-type source layer, 55 represents an insulating film, 56 represents a channel, 57 represents a groove, 58 represents a drain electrode, 59 represents a source electrode, 60 represents a gate electrode, 61 represents a semiconductor substrate, and 62 represents the main surface of the semiconductor substrate 61.

In the semiconductor substrate 61 made of single-crystal silicon carbide, the $n^+$-type layer 51, $n^-$-type drain layer 52, and p-type well layer 53 are formed in order and the p-type well layer 53 of the semiconductor substrate 61 forms the main surface 62. The n-type source layer 54 is formed on part of the surface of the p-type well layer 53. The slender groove 57, perpendicular to the surface 62, extends downward from the n-type source layer 54 to the $n^-$-type drain layer 52 through the p-type well layer 53. The insulating film 55 is formed to substantially cover the exposed plane of the groove 57 and the gate electrode 60 is set on the insulating film 55. The drain electrode 58 makes ohmic contact with the almost entire released plane of the $n^+$-type layer 51 and the source electrode 59 makes ohmic contact with the released plane of the p-type well layer 53 and part of the surface of the n-type source layer 54 connected to the released plane.

A field-effect transistor having the above constitution operates as shown below. When a gate voltage positive to the source electrode 59 is applied to the gate electrode 60 while applying a predetermined operating voltage to the drain electrode 58 and the source electrode 59, the channel 56 is formed on the side wall of the groove 57, thereby current flows from the drain electrode 58, to the source electrode 59 through the channel 56, and the field-effect transistor is turned on. However, when a gate voltage negative to the source electrode 59 is applied to the gate electrode 60, no current flows from the drain electrode 58 to the source electrode 59 because the channel 56 is not formed on the side wall of the groove section 57 and therefore the field-effect transistor is turned off.

In a general field-effect transistor, the p-type well layer 53 on which the channel 56 is formed has a thickness of several microns to tens of microns, which is sufficient to withstand a high reverse applied voltage. However, in a field-effect transistor made of single-crystal silicon carbide, the known thermal diffusion method used for a device made of single-crystal silicon cannot be used to form the p-type well layer 53 because the impurity diffusion coefficient of silicon carbide is very small. Therefore, in the case of the above disclosed field-effect transistor, the thick p-type well layer 53 is formed by the epitaxial method making it possible to form a thick layer relatively easily and thereafter the relatively thin n-type source layer 54 is formed by implanting ions into the surface of the p-type well layer 53. Then, the groove 57 with a depth reaching the n⁻-type drain layer 52 from the n-type source layer 54 is formed by dry etching and the gate electrode 60 is formed on the side wall of the groove 57 through the insulating layer 55 to form the so-called trench-structural field-effect transistor.

By using the above structure, the channel 56 is formed on the thick p-type well layer 53 when applying the above gate voltage to the gate electrode 60 and the field-effect transistor is turned on. The field-effect transistor operates at a high operating voltage and a large operating current and moreover at a high speed.

In this specification, to show a plane of a directional axis of a hexagonal-system single-crystal silicon carbide substrate, a necessary numeral is underlined such as { 1100} plane or <1100> directional axis instead of putting a bar on the numeral because expression means is restricted though a bar should originally be put on the necessary numeral as shown in a general drawing. In this case, however, an underline has the completely same meaning as a bar.

As described above, a semiconductor device used for a power converter requires a high operating voltage, that is, a high maximum voltage (device withstand voltage) to be applied when the device is turned off and a large operating current, that is, a large maximum current to be applied when the device is turned on. A device evaluation index Corresponding to a product of these values is referred to as a power conversion capacity of the device. The disclosed field-effect transistor can operate at a high operating voltage and a large operating current compared to an existing field-effect transistor made of silicon. However, the disclosed field-effect transistor does not make the most use of the advantages of hexagonal-system silicon carbide and moreover has the following problems when the device is turned on/off. Therefore, it does not obtain an adequate power conversion capacity.

First, the problem when the device is turned on is described below. At present, a high-quality silicon carbide layer is normally made of hexagonal-system silicon carbide formed on a single-crystal silicon carbide substrate by epitaxial growth. A hexagonal-system silicon carbide layer, as estimated from its crystal symmetry, has the anisotropy on various properties, particularly on electron transport characteristic in the direction parallel with the crystallographic plane-index {0001} plane and the direction vertical to the {0001} plane, that is, the crystallographic <0001> direction. However, because the anisotropy is not considered for the disclosed field-effect transistor at all, a problem occurs that the on-state resistance of the device is increased. This prevents the maximum current applied when the device is turned on from increasing.

Then, the problem when the device is turned off is described below. The disclosed field-effect transistor causes a large leakage current flowing between the source and the drain compared to the existing field-effect transistor when the gate voltage is turned off. Therefore, the disclosed field-effect transistor cannot always be of high reliability. This represents that the device withstand voltage cannot completely be raised.

The present invention is made to solve the above problems when a semiconductor device is turned on and off and its object is to provide a semiconductor device made of silicon carbide, which has low electrical resistance when the device is turned on, low leakage current between the source and the drain when the device is turned off, and having a high power conversion capacity. A fabricating method of the semiconductor device is also provided.

To solve the first problem of decreasing the on-state resistance of a field-effect transistor made of hexagonal-system silicon carbide, the controlled current path of the field-effect transistor, that is, the flow of current between the source and the drain, is perpendicular to the crystallographic <0001> direction of hexagonal-system silicon carbide, that is, parallel with the crystallographic {0001} plane.

To solve the second problem of decreasing the leakage current between the source and the drain when the field-effect transistor is turned off, the channel forming plane of the field-effect transistor is parallel with the crystallographic {1120} plane.

The inventor of the present invention considered the first problem as shown below and verified the following through experiments. Hexagonal-system silicon carbide has anisotropy in its property as estimated from its crystal symmetry. Particularly, it is reported in the "first separate volume of combination lecture related to 41st Applied Physics Meeting, p. 325 (1994)" that the effective mass of an electron when the electron is transferred in the direction parallel with the crystallographic <0001> direction increases fivefold compared to the case in which it is transferred in the direction perpendicular to the crystallographic <0001> direction. In view of the mobility, this represents that the mobility of the electron transferred in parallel with <0001> is approx. ⅕ the mobility of the electron transferred perpendicular to <0001>. Therefore, as shown in the present invention, by designing a device structure so that the controlled current path, that is, the flow of current between a source and a drain is parallel with the crystallographic {0001} plane, there is little anisotropy of transfer phenomenon in the direction parallel with the {0001} plane and the mobility in this plane is approx. 5 times larger than the mobility of an electron transferred in the <0001> direction. Therefore, it is possible to minimize the electrical resistance against the current flowing when a device is under an ionic state.

The effect of the anisotropy of the above electron mobility influences not only the disclosed field-effect transistor of the metal-oxide-semiconductor type (MOS type). For a semiconductor device frequently used as a semiconductor device for electric power use, which is fabricated by using flat single crystal and operated by setting a current terminal at the surface of the first single crystal and the back of it facing the surface, the present invention effectively functions in any case in which the decrease of on-state resistance of a device improves the characteristics of the device. Therefore, also in the case of a junction field-effect transistor, it is effective for improvement of device characteristics if the current between a source and a drain is parallel with the crystallographic {0001} plane of hexagonal-system silicon carbide. Also in the case of a Schottky-junction diode or a pn-junction diode, it is effective to set the current path between electrodes in the direction parallel with the {0001} plane because the electrical resistance of forward current is decreased. The same is applied to a thyristor and a gate turn-off thyristor.

For the second problem, the inventor of the present invention studied a mechanism in which the leakage current between a source and a drain increases and means for decreasing the gate leakage current from various points of view in accordance with the structural difference between hexagonal-system single-crystal silicon carbide and cubic-system single-crystal silicon as described below by noticing that a large leakage current between a source and a drain generated in the disclosed field-effect transistor is a phenomenon inherent in hexagonal-system single-crystal silicon carbide.

First, in view of the difference between crystal structures, hexagonal-system single-crystal silicon carbide has atoms which are very complexly combined compared to cubic-system single-crystal silicon and includes both a plane index with a lot of planes which are crystallographically equivalent and a plane index with a few planes which are crystallographically equivalent. Single-crystal silicon carbide consists of two elements which are silicon and carbon. Also from this point of view, single-crystal silicon carbide is complex compared to single-crystal silicon consisting of only one element. Moreover, there are some types of hexagonal-system single-crystal silicon carbide with different atomic superimposition cycles in the c-axis direction such as 2H, 4H, and 6H.

Therefore, it is concluded that the leakage current between the source and the drain of the disclosed trench-type field-effect transistor increases because the atomic density of the channel forming plane of the transistor does not become constant when simple pattern arrangement or arrangement of a simple gate structure which is applied to fabrication of the prior art field-effect transistor is performed.

Then, the inventor of the present invention fabricated a lot of field-effect transistors in which various pattern arrangements or arrangement of various types of gate structures are performed by using hexagonal-system single-crystal silicon carbide and examined the leakage current between a source and a drain on these field-effect transistors separately. As a result, it is found that the leakage current substantially decreases only when a specific plane orientation of a channel forming plane is use to form a gate groove at the main surface of a field-effect transistor. Moreover, it is found from the examination result that, in the case of a field-effect transistor in which the leakage current between the source and the drain decreases, the number of free bonds of atoms (so-called dangling bonds) per unit area decreases compared to a field-effect transistor with a lot of leakage current between the source and the drain when the element exposed to the surface of the channel forming plane is either of silicon and carbon. Furthermore, it is found that the crystallographic plane index of the channel forming plane of the field-effect transistor in which the leakage current decreases is the {11$\underline{2}$0} plane.

Furthermore, it is estimated that the leakage current between the source and the drain of the disclosed field-effect transistor increases because a lot of dangling bonds of atoms are present on the channel forming plane, and thereby the interface between the gate insulating film and single-crystal silicon carbide easily become imperfect and a channel which cannot be controlled by the gate voltage is formed in the well layer.

In accordance with the above study results, the present invention takes proper means for the first and second problems. By combining these means at the same time, it is possible to improve both the characteristics for turning on and off a field-effect transistor and adequately increase the power conversion capacity of a device.

For example, when a field-effect transistor operated by using the crystallographic {$\underline{11}$00} plane of hexagonal-system single-crystal silicon carbide as the main surface, forming a groove on the main surface and using the side wall of the groove as a channel forming plane is fabricated by forming the channel forming plane so that it is perpendicular to the main surface or tilts from the main surface by 150° and it is parallel with the crystallographic <0001> direction of the hexagonal-system single-crystal silicon carbide, the controlled current path of the field-effect transistor becomes parallel with the crystallographic {0001} plane and the channel forming plane becomes parallel with the crystallographic {11$\underline{2}$0} plane. Therefore, a field-effect transistor with a structure solving both the first and second problems is obtained.

Moreover, even if a field-effect transistor operated by using the crystallographic {11$\underline{2}$0} plane of hexagonal-system single-crystal silicon carbide as the main surface, forming a groove on the main surface, and using the side wall of the groove as a channel forming plane is fabricated by forming the channel forming plane so that it is parallel with the main surface or tilts from the main surface by 120° and parallel with the crystallographic <0001> direction of the hexagonal-system single-crystal silicon carbide, the controlled current path becomes parallel with the crystallographic {0001} plane of the hexagonal-system single-crystal silicon carbide and the channel forming plane becomes parallel with the crystallographic {11$\underline{2}$0} plane. Therefore, also in this case, a field-effect transistor with a structure solving both the first and second problems is obtained.

Though it is effective for a MOS field-effect transistor to use the crystallographic {11$\underline{2}$0} plane as a channel forming plane, the advantage is not restricted to the above. As previously described, because the crystallographic {11$\underline{2}$0} plane of hexagonal-system silicon carbide essentially allows leakage current to decrease, it is effective for decreasing leakage current and improving device reliability to fabricate a device so that a plane to which an intense electric field is applied in view of the device structure is parallel with the crystallographic {11$\underline{2}$0}. For example, it is effective to fabricate a device so that an edge to which an intense electric field is applied is parallel with the {11$\underline{2}$0} plane in a guard ring structure or a mesa structure.

In accordance with the above examination and study results, the present invention uses the above first and second means. By using these first and second means, it is possible to decrease the electrical resistance of current of a semiconductor device such as a field-effect transistor made of hexagonal-system single-crystal silicon carbide flowing when the device is turned on and also decrease the leakage current of the device when it is turned off. Therefore, it is possible to obtain not only a semiconductor device having a large conversion capacity but also a semiconductor device which stably operates under a high temperature environment of 300° C. or higher and has a high reliability. Moreover, these facts are also effected for such types of hexagonal-system silicon carbide as 2H, 4H, and 6H.

Because the semiconductor device obtained by the present invention can be designed to have a power conversion capacity of 1,000 kVA or more, it can be applied to a power converter such as a HVDC system, BTB system, or SVC system. Moreover, by designing the semiconductor device to have a power conversion capacity of 100 to 10,000 kVA, it is possible to fabricate an inverter for variable-speed driving of a motor.

BRIEF DESCRIPTION OF DRAWINGS

FIGS. 2(a) to 2(c) are illustrations showing the structure of the unit lattice of hexagonal-system single-crystal silicon carbide;

FIG. 7 is a top view showing the outline of the constitution of the fifth embodiment of the field-effect transistor of the present invention;

Description of Symbols

1 ... $n^+$-type layer, 2 ... $n^-$-type drain, 3 ... p-type well layer, 4 ... n-type source, 5 ... Insulating film, 6 ... Channel, 7 ... Groove section, $7_1$ ... First groove, $7_2$ ... Second groove. $7_3$ ... Third groove, $7_4$ ... Fourth groove, $7_5$ ... Fifth groove, $7_7$ ... Seventh groove, $7_8$ ... Eighth groove, $7_9$ ... Ninth groove, $7_{10}$ ... Tenth groove, $7_{11}$ ... Eleventh groove, $7_{12}$ ... Twelfth groove, 8 ... Large side wall (channel forming plane) of groove section 7, $8_1$ ... Side wall tilting from main surface 13 by 150° clockwise, $8_2$ ... Side wall tilting from main surface 13 by 150° counterclockwise, $8_3$ ... Side wall vertical to main surface 13, $8_4$ ... Side wall tilting from main surface 13 by 120° clockwise, $8_5$ ... Side wall tilting from main surface 13 by 120° counterclockwise, $8_6$ ... Side wall parallel with main surface 13, 9 ... Drain electrode, 10 ... Source electrode, 11 ... Gate electrode, 12 ... Semiconductor substrate, 13 ... Main surface of semiconductor substrate 12, 14 ... Path of current flowing for turned on, 15 ... p-type gate layer, 16 ... p-type channel layer, 17 ... n-type source layer, 18 ... Field-effect transistor, 19 ... Integrated circuit (IC) for controlling field-effect transistor 18, 51 ... n-type ($n^+$-type) silicon carbide layer (or support) with low resistivity, 52 ... n-type ($n^-$-type) silicon carbide layer with low resistivity, 53 ... p-type silicon carbide layer, 54 ... n-type silicon carbide layer, 55 ... Gate insulating film, 56 ... Groove section, 57 ... Drain electrode, 58 ... Source electrode, 59 ... Gate electrode

DETAILED DESCRIPTION OF PREFERRED EMBODIMENTS

Figure 1A:
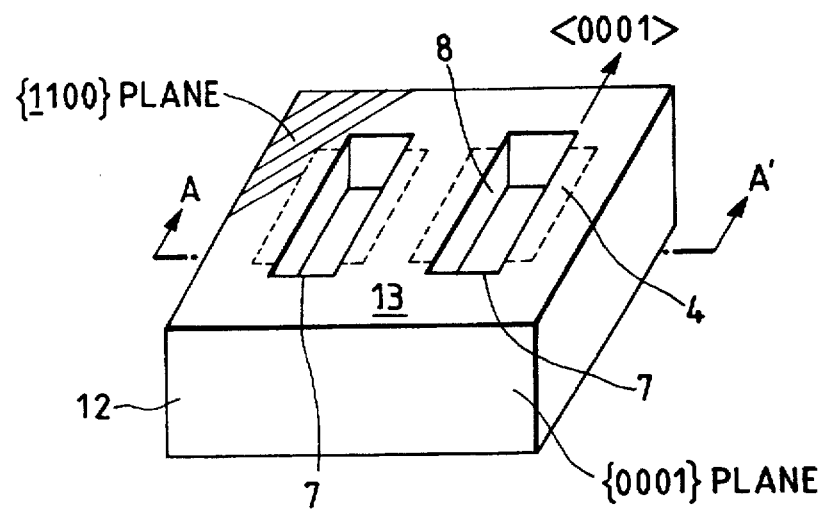
FIGS. 1(a) and (b) are perspective views showing the constitution of the first embodiment of the field-effect transistor of the present invention.
Figure 1B:
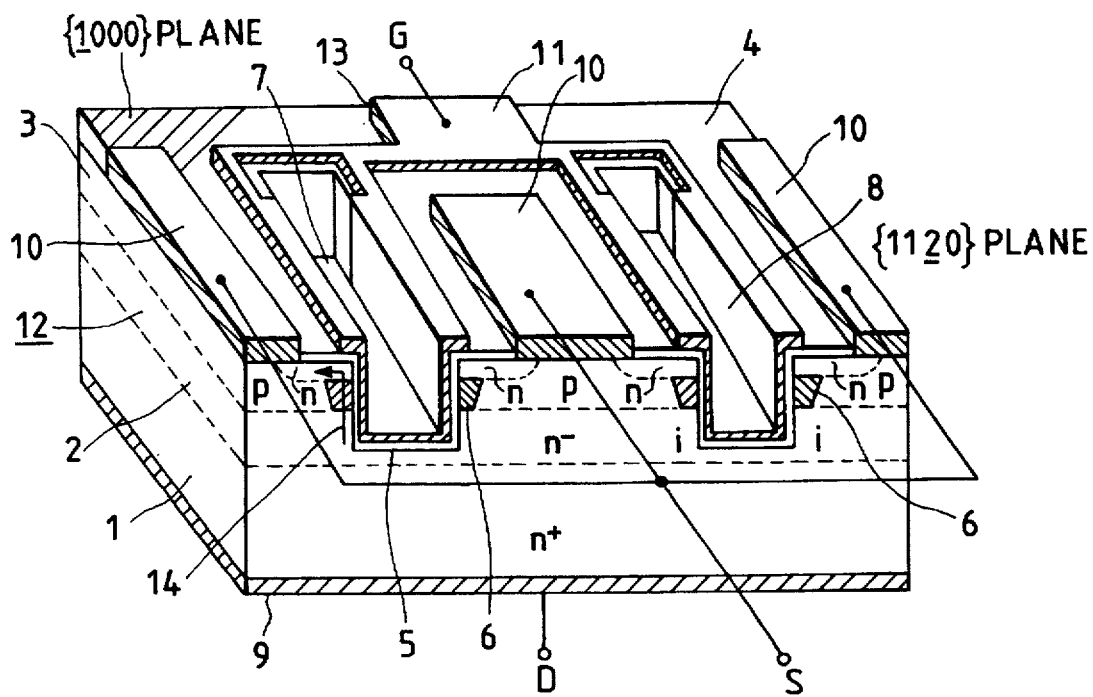

FIGS. 1(a) and 1(b) are perspective views showing the constitution of the first embodiment of the field-effect transistor of the present invention, in which FIG. 1(a) is a schematic block diagram showing the main portion of the constitution and FIG. 1(b) is a sectional block diagram showing the detail of the constitution in FIG. 1(a), taken along the line A–A'in FIG. 1 (a).

In FIGS. 1(a) and 1(b), numeral 1 represents an $n^+$-type layer, 2 represents an $n^-$-type drain layer, 3 represents a p-type well layer, 4 represents an n-type source layer, 5 represents an insulating film, 6 represents a channel, 7 represents a groove, 8 represents a large side wall (channel forming plane) of the groove 7, 9 represents a drain electrode, 10 represents a source electrode, 11 represents a gate electrode, 12 represents a semiconductor substrate, 13 represents the main surface of the semiconductor substrate 12, and 14 represents a path of current flowing when a field-effect transistor is turned on.

In the semiconductor substrate 12, the $n^+$-type wafer layer, $n^-$-type drain layer 2, and p-type well layer 3 are formed in order and the p-type well layer 3 of the semiconductor substrate 12 forms the main surface 13. The n-type source layer 4 is formed on part of the surface of the p-type well layer 3. The slender groove 7, perpendicular to the surface 13 and substantially rectangular, extends downward from the n-type source layer 4 to the n-type drain layer 2 through the p-type well layer 3. The insulating film 5 is formed to substantially cover the exposed plane of the groove section 7 and the gate electrode 11 is set on the insulating film 5. The drain electrode 9 makes ohmic contact with the released plane of the $n^+$-type layer 1 and the source electrode 10 makes ohmic contact with the released plane of the p-type well layer 3 and part of the surface of the n-type source layer 4 connected to the released plane.

FIGS. 2(a), 2(b), and 2(c) are illustrations showing the unit lattice of hexagonal-system single-crystal silicon carbide. In the case of vectors $a_1$, $a_2$, and $a_3$ which are present in the same plane and intersect each other at an angle of 120° in FIGS. 2(a), 2(b), and 2(c), $a_1$ is the <0001> directional axis of the unit lattice, $a_2$ is the <0100> directional axis of the unit lattice, and $a_3$ is the <0010> directional axis of the unit lattice. The c axis is an axis extending in the direction perpendicular to the <1000> directional axis $a_1$, <0100> directional axis $a_2$, and <0010> directional axis $a_3$. Moreover, the {0001} plane is parallel with the <1000> directional axis $a_1$, <0100> directional axis $a_2$, and <0010> directional axis $a_3$ as shown by diagonals in FIG. 2(a), that is, a plane having the c axis as a vertical line. Moreover, as shown by diagonals in FIG. 2(b), the {1100} plane is intersects the <1000> directional axis $a_1$ and the <0100> directional axis $a_2$ at the equal distance from the center and parallel with the vertical axis c. Furthermore, as shown by diagonals in FIG. 2(c), the {1120} plane intersects the <1000> directional axis $a_1$ and the <0100> directional axis $a_2$ at the equal distance from the center, further intersecting the <0010> directional axis $a_3$ at the position ½ the distance from the center and parallel with the <1100> directional axis perpendicular to the <0010> directional axis $a_3$.

In this case, the field-effect transistor shown in FIG. 1 is constituted so that the main surface 13 of the semiconductor substrate 12 fits the {1100} plane of hexagonal-system single-crystal silicon carbide and the groove 7 formed on the main surface 13 is selected so that the longitudinal direction of the groove 7 coincides with the <0001> directional axis of hexagonal-system single-crystal silicon carbide, the large side wall 8 (channel forming plane) of the groove 7 fits the {1120} plane of hexagonal-system single-crystal silicon carbide, and the path 14 of the current flowing when the field-effect transistor is turned on is parallel with the {0001} plane.

The operation of the field-effect transistor of the first embodiment is substantially the same as that of the disclosed field-effect transistor. When a gate voltage positive to the source electrode 10 is applied to the gate electrode 11 while applying an operating voltage with a predetermine polarity to the drain electrode 9 and the source electrode 10, the channel 6 is formed on the large side wall 8 of the groove 7, current flows from the drain electrode 9 to the source electrode 10 through the channel 6 as shown in FIG. 14, and the field-effect transistor is turned on. When applying a gate voltage negative to the source electrode 10 to the gate electrode 11, no current flows from the drain electrode 9 to the source electrode 10 because the channel 6 is not formed and the field-effect transistor is turned off.

According to this embodiment, the groove 7 is formed so that the longitudinal direction of the groove 7 is parallel with the <0001> directional axis of hexagonal-system single-crystal silicon carbide and the large side wall 8 is formed on the channel 6 when applying the positive gate voltage. Therefore, the channel forming plane becomes a plane in which the number of atoms and the number of dangling bonds of atoms per unit area decrease in hexagonal-system single-crystal silicon carbide and thereby the leakage current between the source and the drain is substantially decreased when the field-effect transistor is turned off compared to the disclosed field-effect transistor. Moreover, when the field-effect transistor is turned on, the current 14 flows only through the {0001} plane with a large mobility but it does not flow in the <0001> direction with a small mobility. Therefore, the electrical resistance of the field-effect transistor is substantially decreased compared to that of the disclosed field-effect transistor.

FIGS. 3(a) to 3(e) are sectional block diagrams showing a fabrication process of the field-effect transistor shown in FIG. 1. In FIGS. 3(a) to 3(e), like components in FIG. 1 have like reference numerals. The field-effect transistor shown in FIG. 1 is fabricated through the process described below.

Figure 3A:
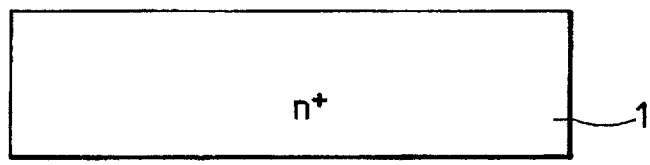
FIGS. 3(a) to 3(e) are illustrations showing a field-effect transistor fabrication process.
Figure 3B:
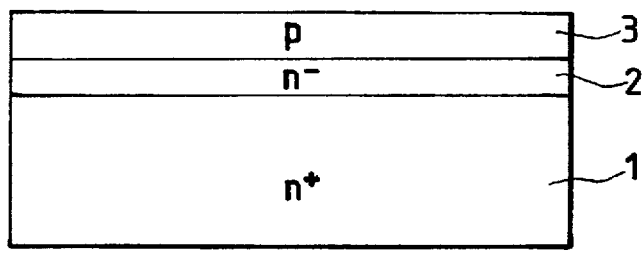
Figure 3C:
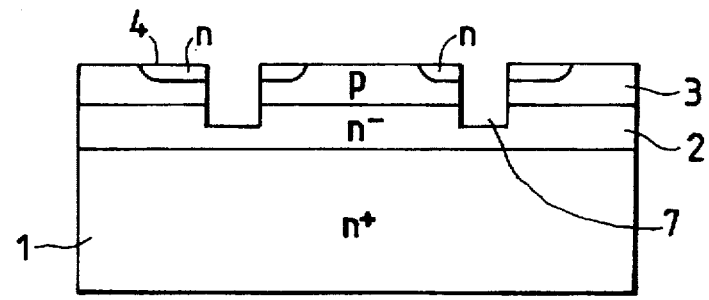
Figure 3D:
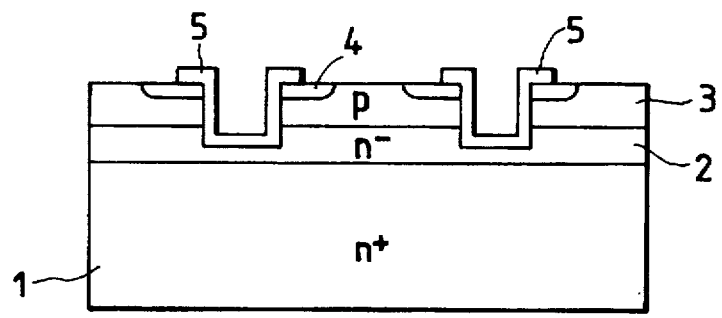
Figure 3E:
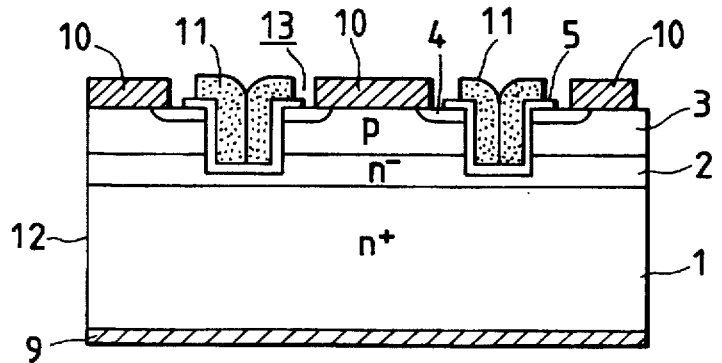

First, as shown in FIG. 3(a), an n$^+$-type hexagonal-system single-crystal silicon carbide wafer (n$^+$-type layer) 1 having a low resistivity is prepared which is sliced so that the {1100} plane serves as the main surface 12. Then, as shown in FIG. 3(b), an n-type drain layer 2 with a desirable resistivity and thickness is formed on the main surface 12 of the single-crystal wafer 1 by using, for example, silane and propane as material gases and epitaxially growing the layer 2 while adding n-type impurity gas to the layer 2. Then, as shown in FIG. 3(c), the surface of the p-type well layer 3 is locally oxidized to form an oxide film and n-type impurity ions are implanted into the layer 3 by using the oxide film as a mask to locally form an n-type source layer 4 on the layer 3. Thereafter, the surface of the n-type source layer 4 is locally oxidized to form a new oxide film to form a groove 7 reaching the n-type drain layer 2 from the surface of the n-type source layer 4 through the p-type well layer 3 by using the new oxide film as a mask so that the longitudinal direction of the groove 7 is parallel with the <0001> directional axis of the single-crystal wafer 1 made of hexagonal-system silicon carbide by means of dry etching. Then, as shown in FIG. 3(d), each side wall 8 of the groove 7 and part of the surface of the n-type source layer 4 connected to the side wall 8 are oxidized to form an insulating film 5 and unnecessary portion of the insulating film 5 is removed by patterning it. Finally, as shown in FIG. 3(e), the groove section 7 is filled with polysilicon to form a gate electrode 11. Moreover, a drain electrode 9 made of a metallic thin film is formed on the other released plane of the single-crystal wafer 1, a source electrode 10 made of a metallic thin film is formed on the exposed plane of the p-type well layer 3 and the surface of the n-type source layer 4 connected to the exposed plane. Thereafter, the wafer 1 is cut into pellets to finish a field-effect transistor.

Figure 4A:
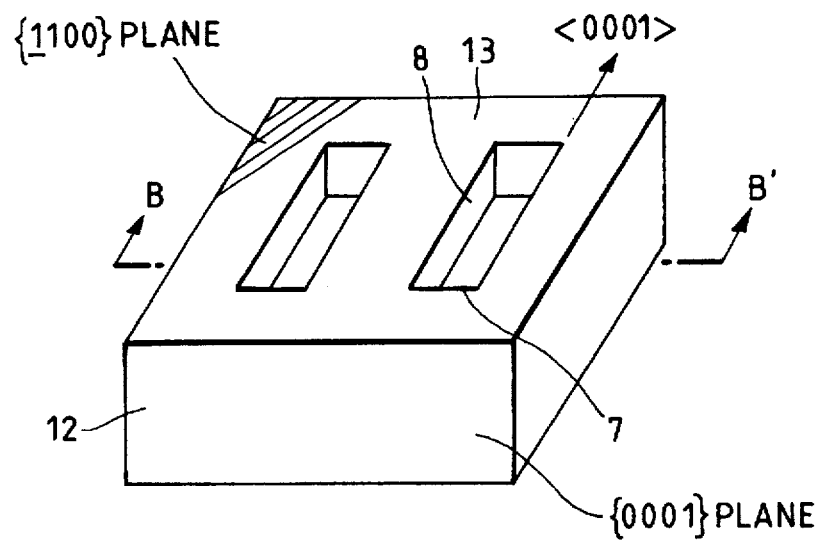
FIGS. 4(a) and 4(b) are schematic block diagrams showing the constitution of the second embodiment of the field-effect transistor of the present invention.
Figure 4B:
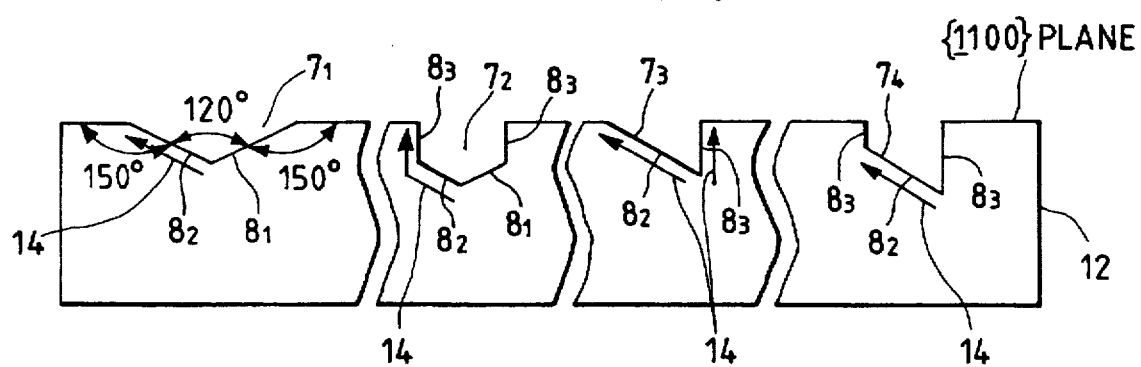

FIGS. 4(a) and 4(b) are schematic block diagrams showing the constitution of the second embodiment of the field-effect transistor of the present invention, in which FIG. 4(a) is a schematic block diagram showing the main portion of the constitution and FIG. 4(b) is a sectional block diagram of the constitution in FIG. 4(a), taken along the line B–B' of FIG. 4(a).

In FIGS. 4(a) and 4(b), numeral $7_1$ represents a first groove, $7_2$ represents a second groove, $7_3$ represents a third groove, $7_4$ represents a fourth groove, $8_1$ represents a side wall tilting from the main surface 13 by 150° clockwise, $8_2$ represents a side wall tilting from the main surface 13 by 150° counter-clockwise, and $8_3$ represents a side wall vertical to the main surface 13, and like components in FIG. 1 have like reference numerals. Also in the case of the second embodiment, the main surface 13 is selected to fit the {1100} plane of hexagonal-system single-crystal silicon carbide similarly to the case of the first embodiment. Moreover, the side wall of the groove 7 comprises a portion perpendicular to the main surface 13 and a portion tilting from the main surface 13 by 150° and the plane for the channel 6 is parallel with the <0001> directional axis of hexagonal-system single-crystal silicon carbide.

Moreover, in the case of the second embodiment, it is possible to variously change the cross section of the groove 7 as described below. Therefore, the first groove $7_1$ is formed by two side walls $8_1$ and $8_2$ tilting from the main surface 13 by 150° clockwise and counterclockwise respectively, the second groove $7_2$ is formed by two side walls $8_3$ perpendicular to the main surface 13 and two side walls $8_1$ and $8_2$ tilting from the main surface 13 by 150° clockwise and counterclockwise respectively, the third groove $7_3$ is formed by one side wall $8_3$ perpendicular to the main surface 13 and the side wall $8_2$ tilting from the main surface 13 by 150° counterclockwise, and the fourth groove $7_4$ is formed by two side walls $8_3$ perpendicular to the main surface 13 and the side wall $8_2$ tilting from the main surface 13 by 150°. Thus, any one of the side walls $8_1$, $8_2$, and $8_3$ is formed so as to serve as the plane for the channel 6.

According to the above constitution, the plane for the channel 6 includes fewer atoms and dangling bonds of atoms per unit area in hexagonal-system single-crystal silicon carbide similarly to the first embodiment. Thereby it is possible to substantially decrease the leakage current between the source and the drain of the field-effect transistor of the present invention when it is turned off compared to that of the disclosed field-effect transistor. Moreover, because the current 14 flows in the direction parallel with the {0001} strain with a large mobility when the field-effect transistor is turned on, it is possible to decrease the on-state resistance of the field-effect transistor of the present invention compared to that of the disclosed field-effect transistor.

Figure 5A:
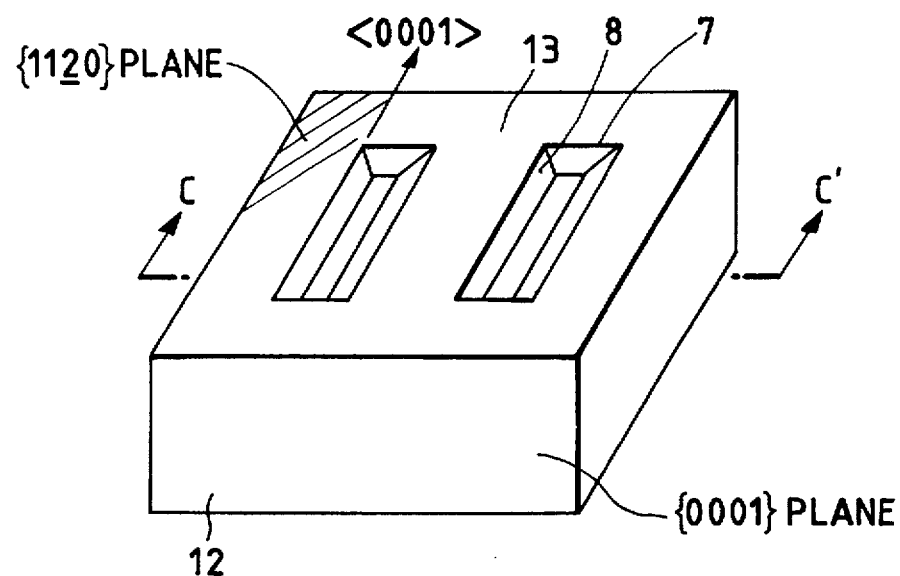
FIGS. 5(a) and 5(b) are schematic block diagrams showing the constitution of the third embodiment of the field-effect transistor of the present invention.
Figure 5B:
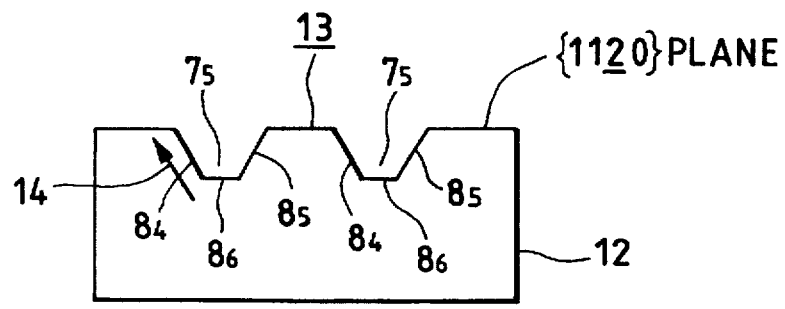

FIGS. 5(a) and 5(b) are schematic block diagrams showing the third embodiment of the field-effect transistor of the present invention, in which FIG. 5(a) is a schematic block diagram showing the constitution of the main portion and FIG. 5(b) is a sectional block diagram of the constitution in FIG. 5(a), taken along the line C–C' of FIG. 5(a).

In FIGS. 5(a) and 5(b), numeral $7_5$ represents a fifth groove section, $8_4$ represents a side wall tilting from the main surface 13 by 120° clockwise, $8_5$ represents a side wall tilting from the main surface 13 by 120° counterclockwise, and $8_6$ represents a side wall perpendicular to the main surface 13, and like components in FIG. 4 have like reference numerals.

In the first and second embodiments, the main surface 13 of the semiconductor substrate 12 is selected to fit the {1100} plane of hexagonal-system single-crystal silicon carbide. In the third embodiment, however, the main surface 13 is selected to fit the {1120} plane of hexagonal-system single-crystal silicon carbide. Moreover, in the case of the second embodiment, the side wall of the groove 7 is formed by a portion perpendicular to the main surface 13 and a portion tilting from the main surface 13 by 150°. In the third embodiment, however, the side wall of the groove 7 is formed by two side walls $8_4$ and $8_5$ tilting from the main surface 13 by 120° and the side wall $8_6$ perpendicular to the main surface 13. Thus, any one of the side walls $8_4$, $8_5$, and $8_6$ serves as the plane for the channel 6.

According to the above constitution, the plane for the channel 6 includes fewer atoms and dangling bonds of atoms per unit area in hexagonal-system single-crystal silicon carbide similarly to the above first and second embodiments, and thereby it is possible to substantially decrease the leakage current between the source and the drain of the field-effect transistor of the present invention when it is turned off compared to that of the disclosed field-effect transistor.

Also in this case, it is possible to decrease the on-state resistance of the field-effect transistor of the present invention compared to that of the prior art field-effect transistor because the current 14 flows in the direction parallel with the {0001} plane when the field-effect transistor is turned on.

The field-effect transistor fabrication processes of the second and third embodiments are almost the same as that of the first embodiment. Therefore, detailed description of them is omitted. As the semiconductor wafer 1 to be first prepared, however, it is necessary to prepare the hexagonal-system single-crystal silicon carbide wafer 1 sliced so that the crystal plane orientation {1100} coincides with the main surface 12 for the first and second embodiments and the hexagonal-system single-crystal silicon carbide wafer 1 sliced so that the crystal plane orientation {1120} coincides with the main surface 12 for the third embodiment. Moreover, it is necessary to form the groove 7 on the main surface 13 of the single-crystal wafer 1 so that the longitudinal direction of the groove 7 becomes parallel with the <0001> directional axis of the hexagonal-system single-crystal silicon carbide wafer 1 for any embodiment. Furthermore, it is necessary to form the cross section of the groove 7 like a U shape for the first embodiment and like the shapes shown in FIGS. 4(b) and 5(b) for the second and third embodiments.

Figure 6A:
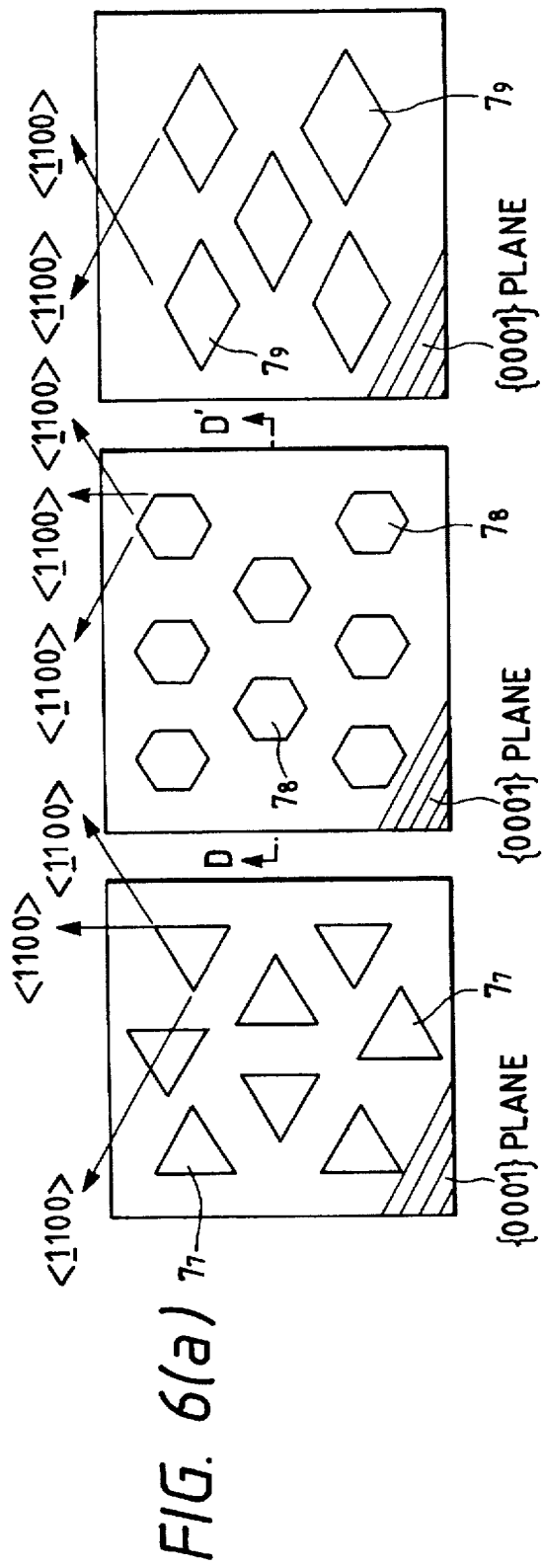
FIGS. 6(a) and 6(b) are block diagrams showing the outline of the constitution of the fourth embodiment of the field-effect transistor of the present invention.
Figure 6B:
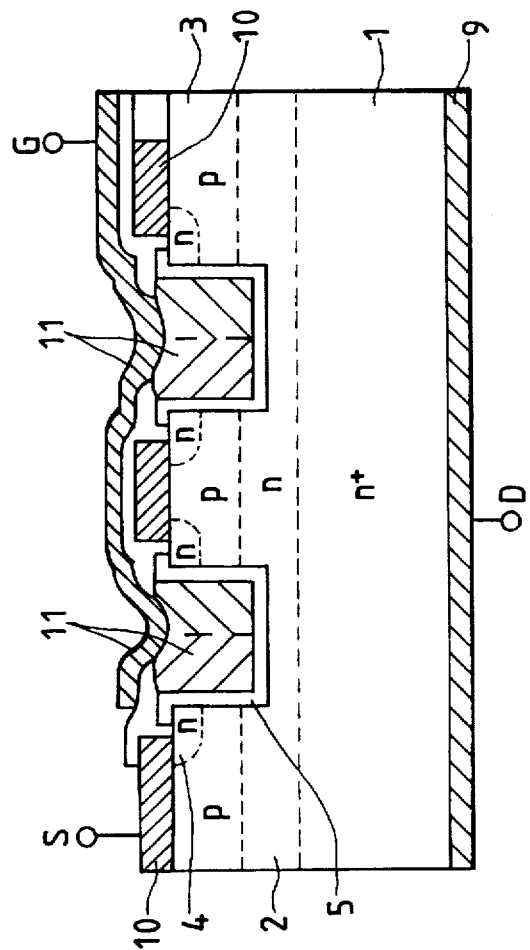

FIGS. 6(a) and 6(b) are block diagrams showing the outline of the constitution of the fourth embodiment of the field-effect transistor of the present invention, in which FIG. 5(a) is a top view of the constitution and FIG. 5(b) is a sectional view of the constitution in FIG. 5(a), taken along the line D–D' of FIG. 5(a).

In FIGS. 6(a) and 6(b), symbol $7_7$ represents a seventh groove, $7_8$ represents an eighth groove, and $7_9$ represents a ninth groove, and like components in FIG. 1 have like reference numerals.

The main surface 13 of the semiconductor substrate 12 is constituted to fit the {0001} plane of hexagonal-system single-crystal silicon carbide. A plurality of grooves 7, perpendicular to the surface 13, extend downward from the n-type source layer 4 to the n⁻-type drain layer 2 through the p-type well layer 3. These grooves 7 are included in any type of the seventh groove $7_7$, eighth groove, $7_8$, and ninth groove $7_9$ which are triangular, hexagonal, and parallelogrammic respectively when viewed from the top. Moreover, side walls of the seventh to ninth grooves $7_7$, $7_8$, and $7_9$ are formed in the direction coinciding with the <1100> directional axis of hexagonal-system single-crystal silicon carbide and thereby the plane for the channel 5 is formed to fit the {1120} plane of hexagonal-system single-crystal silicon carbide. In this case, the gate electrode 11 is provided with a double-layer wiring structure extending onto the source electrode 10 through an insulating film (not illustrated) in order to prevent a short circuit between the electrode 11 and the source electrode 10 entirely arranged around the seventh groove $7_7$. The hexagonal-system single-crystal silicon carbide structure has six planes perpendicular to the main surface 13 and equivalent to the {1120} plane when an internal angle is assumed as 120°. Therefore, each of side walls of the seventh to ninth grooves $7_7$, $7_8$, and $7_9$ of the fourth embodiment forms the {1120} plane.

In general, a field-effect transistor in which a lot of micro grooves 7 is formed on the main surface 13 of the semiconductor substrate 12 and all side walls of these grooves 7 are used as gates can operate at a high speed and also the operable current capacity of the field-effect transistor per unit area can be increased.

In the fourth embodiment, the advantage by the anisotropy of the mobility cannot be obtained because the path of the electric field when the field-effect transistor is turned on is parallel with the <0001> direction. However, because side walls of the seventh to ninth grooves $7_7$, $7_8$, and $7_9$ whose upper plane shape (released plane) are triangular, hexagonal, and parallelogrammic respectively are arranged and formed to coincide with the <1100> plane of hexagonal-system single-crystal silicon carbide and the plane for the channel 6 serves as the {1120} plane of hexagonal-system single-crystal silicon carbide, the plane for the channel 6 becomes a plane having fewer atoms and dangling bonds of atoms per unit area similarly to the above first to third embodiments and thereby it is possible to substantially decrease the leakage current between the source and the drain of the field-effect transistor of the present invention when it is turned off compared to that of the disclosed field-effect transistor, and moreover operate the field-effect transistor of the present invention at a high speed and increase the operable current capacity per unit area.

FIG. 7 is a top view showing the outline of the constitution of the fifth embodiment of the field-effect transistor of the present invention.

In FIG. 7, symbol $7_{10}$ represents a tenth groove, $7_{11}$ represents an eleventh groove, and $7_{12}$ represents a twelfth groove, and like components in FIG. 1 have like reference numerals.

The main surface 12 of the semiconductor substrate 12 is formed to fit the {0001} plane of hexagonal-system single-crystal silicon carbide. A plurality of grooves 7, perpendicular to the surface 13, extend downward from the n-type source layer 4 to the n-type drain layer 2 through the p-type well layer 3. These grooves 7 are included in any type of tenth groove $7_{10}$, eleventh groove $7_{11}$, and twelfth groove $7_{12}$ which are trapezoid, slender hexagonal, and parallelogrammic when viewed from the top, and each of side walls of the tenth to twelfth grooves $7_{10}$, $7_{11}$, and $7_{12}$ is formed to fit the <1100> plane of hexagonal-system single-crystal silicon carbide and thereby the plane for the channel 6 is formed to fit the {1120} plane of hexagonal-system single-crystal silicon carbide.

Also in this fifth embodiment, each of large side walls of the tenth to twelfth grooves $7_1 0$, $7_{11}$, and $7_{12}$ whose upper plane (released plane) are triangular, hexagonal, and parallelogrammic respectively are arranged and formed to coincide with the $<\underline{1}100>$ plane of hexagonal-system single-crystal silicon carbide and the plane for the channel 6 serves as the $\{11\underline{2}0\}$ plane of hexagonal-system single-crystal silicon carbide, the plane for the channel 6 includes fewer atoms and dangling bonds of atoms per unit area similarly to the above first to third embodiments and thereby it is possible to substantially decrease the leakage current between the source and the drain of the field-effect transistor of the present invention when it is turned off compared to that of the disclosed field-effect transistor.

In the above fourth and fifth embodiments, the plane parallel with the $<0001>$ directional axis of hexagonal-system single-crystal silicon carbide and tilting from the main surface 13 by 30° also serves as the $\{11\underline{2}0\}$ plane. However, the $\{11\underline{2}0\}$ plane is excluded from the present invention because the plane is formed inside the main surface 13 of the semiconductor substrate 12 and thereby it is very difficult to form electrodes.

The above embodiments are described as trench-type field-effect transistors. However, the present invention is not restricted to the trench-type field-effect transistor but it can also be applied to the planar field-effect transistor in which a channel forming plane is formed on the plane same as the source and drain arranging portion. In this case, by using the main surface 13 of the semiconductor substrate 12 as the $\{11\underline{2}0\}$ plane of hexagonal-system single-crystal silicon carbide, the plane for the channel also serves as the $\{11\underline{2}0\}$ plane and a planar field-effect transistor with the above characteristics can be obtained.

Figure 8A:
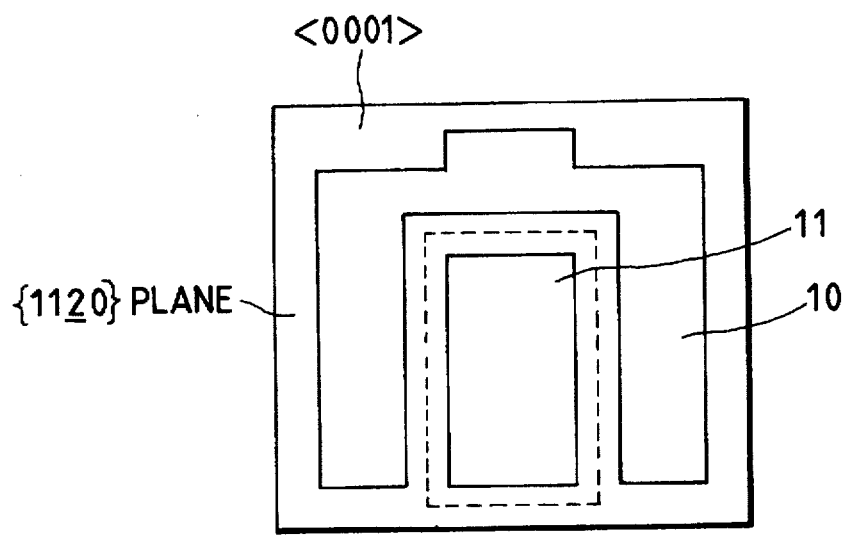
FIGS. 8(a) and 8(b) are a top view and a sectional view showing the outline of the constitution of the sixth embodiment of the field-effect transistor of the present invention.
Figure 8B:
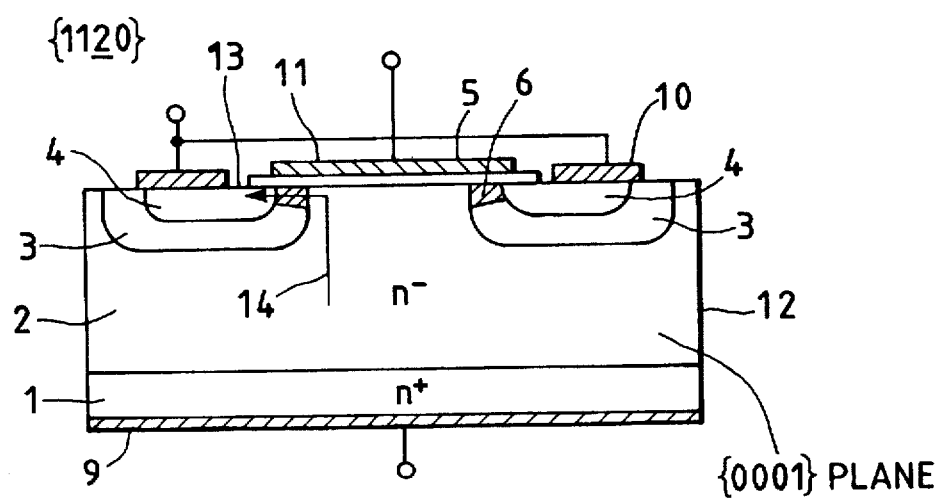

FIGS. 8(a) and 8(b) are a top view and a sectional view showing the outline of the constitution of the sixth embodiment obtained by applying the present invention to a planar field-effect transistor. Like components in FIG. 1 have like reference numerals.

According to this embodiment, a channel forming plane is formed in parallel with the $\{11\underline{2}0\}$ plane and has fewer atoms and dangling bonds per unit area and thereby the leakage current between the source and the drain of the field-effect transistor of the present invention when it is turned off is substantially decreased compared to that of the disclosed field-effect transistor. Also in this case, because the current flows in the direction parallel with the $\{0001\}$ plane with a large mobility, it is possible to decrease the on-state resistance compared to the known field-effect transistor described above.

Figure 9:
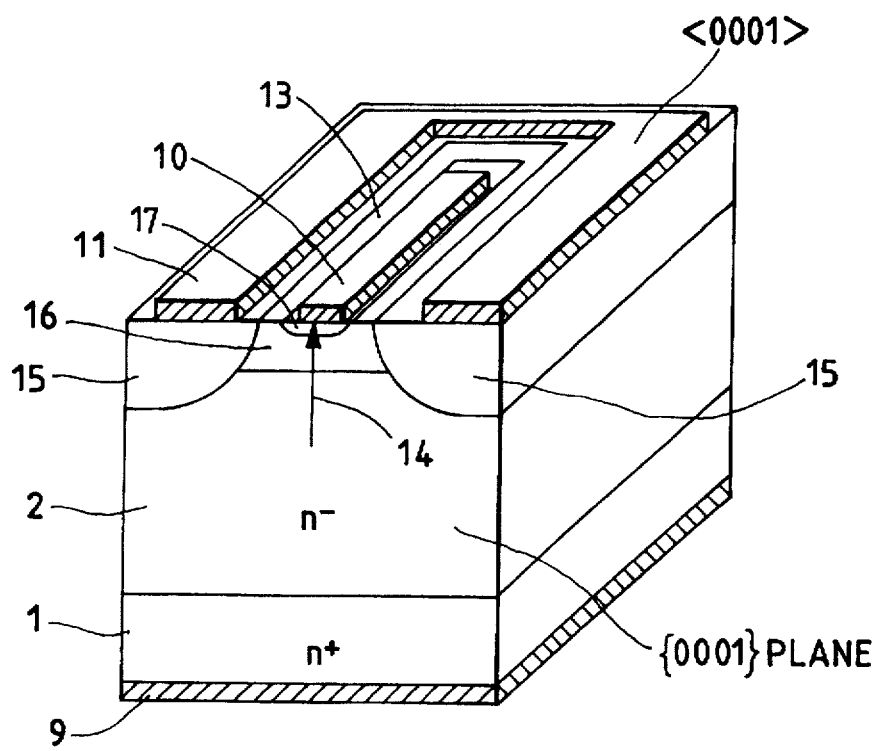
FIG. 9 is a perspective view showing the outline of the constitution of the seventh embodiment of the field-effect transistor of the present invention.

FIG. 9 is a perspective view showing the outline of the constitution of the seventh embodiment of the field-effect transistor of the present invention. Like components in FIG. 1 have like reference numerals. In FIG. 9, numeral 15 represents a p+-type gate layer, 16 represents a p-type channel layer, and 17 represents an n-type source layer.

In this case, the field-effect transistor illustrated in FIG. 9 includes the main surface 13 parallel with the $<0001>$ plane of hexagonal-system silicon carbide, and the path 14 of the current is parallel with the $\{0001\}$ plane.

The field-effect transistor illustrated in FIG. 9 is a junction field-effect transistor, rather than a metal-oxide-semiconductor field-effect transistor as illustrated in FIG. 1 or 8. In this case, the channel layer 16 is turned on by applying a gate voltage negative to the source electrode 10 to the gate electrode 11 and the current 14 flows from the drain electrode 9 to the source electrode 10. Also in this case, because the current flows in the direction parallel with the $\{0001\}$ plane with a large mobility, it is possible to decrease the on-state resistance compared to that of the known junction field-effect transistor and the same advantage as the embodiments 1 to 3 and 6 is obtained.

Figure 10:
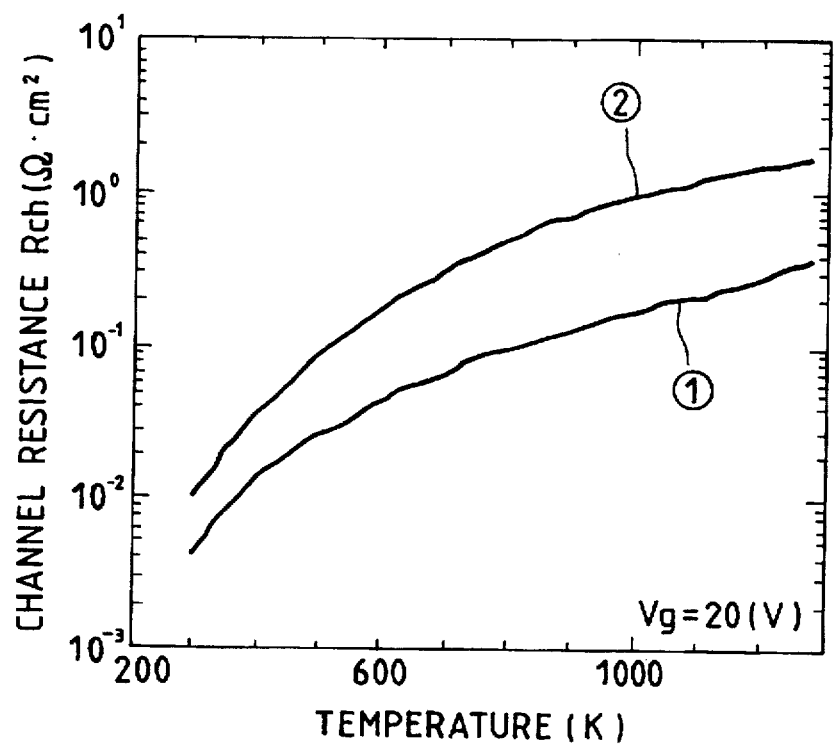
FIG. 10 is an illustration for comparing the temperature dependency of a on-state channel resistance of the field-effect transistor of the present invention with the characteristic of a generally known field-effect transistor.

FIG. 10 shows the results of examining the temperature dependency of a channel resistance when a field-effect transistor is turned on. In FIG. 10, number $<1>$ represents the characteristic of the field-effect transistor of the embodiment 1 of the present invention and number $<2>$ represents the characteristic of a known field-effect transistor when the gate voltage is 20 V and the carrier density of the carrier forming region is $10_{16}$ cm$^{-3}$. From FIG. 10, it is found that the field-effect transistor of the present invention has a channel resistance one digit smaller than that of the known field-effect transistor and the device performance is improved.

Therefore, the embodiments of the present invention make it possible to substantially decrease the on-state resistance of the field-effect transistor fabricated on the semiconductor 12 made of hexagonal-system single-crystal silicon carbide compared to that of a known field-effect transistor.

Figure 11:
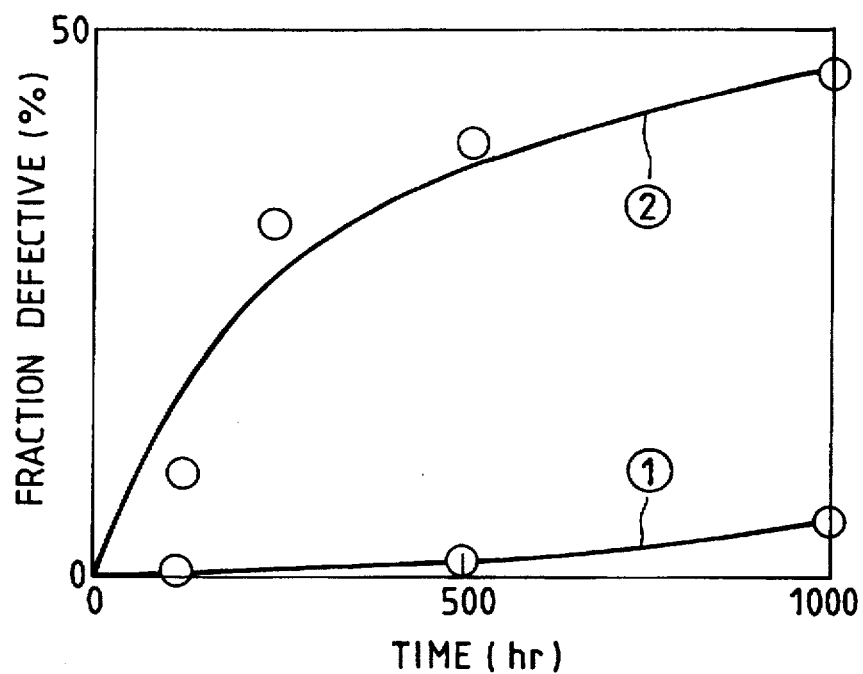
FIG. 11 is a characteristic diagram showing the result of examining the rate for electrical characteristics to deteriorate through an operating test in a constant-temperature oven at 300° C. for 1,000 hr.

FIG. 11 shows the result of examining the rate for electrical characteristics of the field-effect transistor of the present invention and an known field-effect transistor to deteriorate through an operating test of the field-effect transistors in a constant-temperature oven at 300° C. for 1,000 hr by assuming that the field-effect transistors are applied to motor control of a streetcar, electric vehicle, or steel plate rolling machine or frequency conversion in a substation.

In FIG. 11, number $<1>$ represents the electrical characteristic of the field-effect transistor of the present invention and number $<2>$ represent that of the known field-effect transistor. From FIG. 11, it is found that the reliability of the field-effect transistor of the present invention is greatly improved compared to that of the known field-effect transistor.

Therefore, the embodiments of the present invention make it possible to substantially decrease the leakage current between the source and the drain of a field-effect transistor fabricated on the semiconductor substrate 12 made of hexagonal-system single-crystal silicon carbide compared to that of a known field-effect transistor and greatly improve the reliability of the field-effect transistor.

Figure 12:
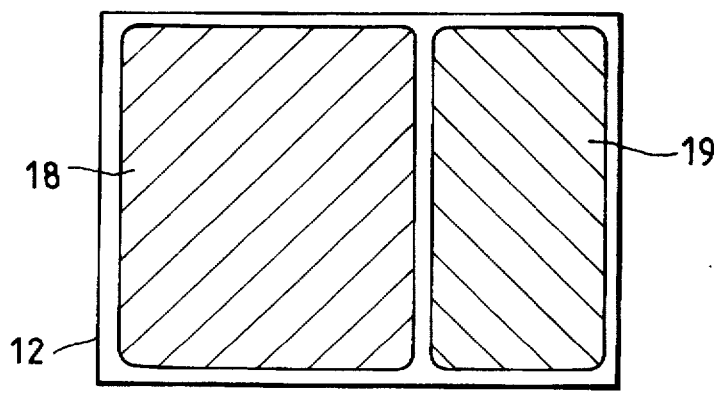
FIG. 12 is a schematic block diagram of an IC for electric power use provided with the field-effect transistor of the present invention.
Figure 13A:
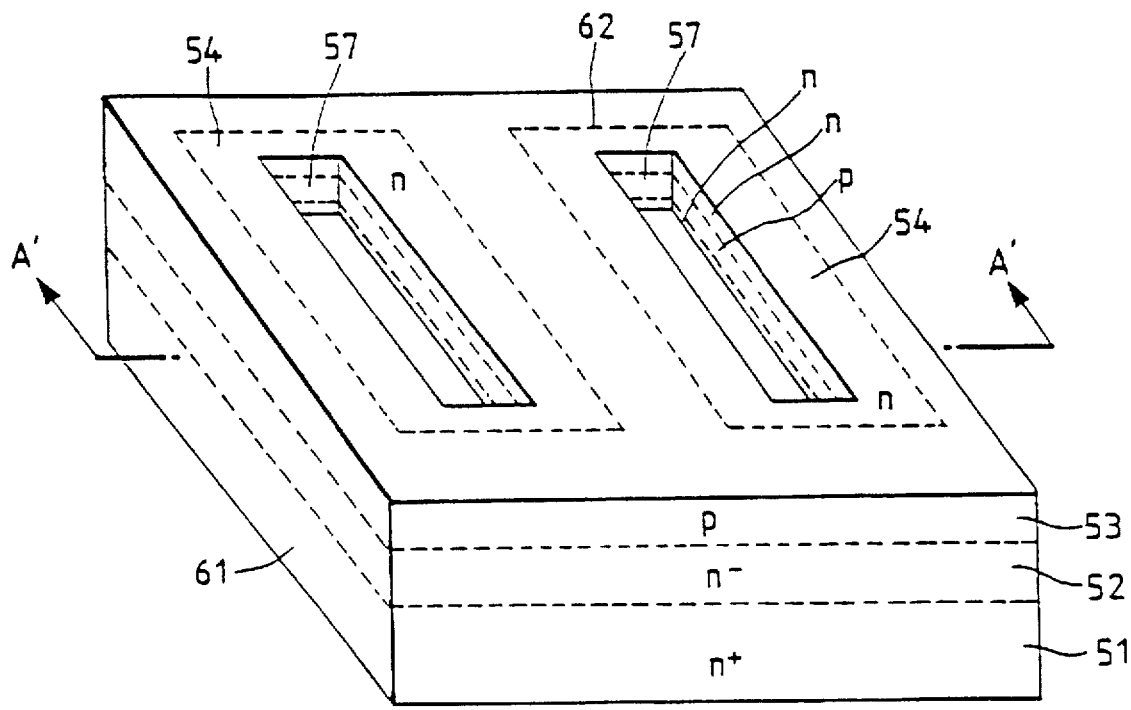
FIGS. 13(a) and 13(b) are sectional views showing the constitution of a generally known field-effect transistor.
Figure 13B:
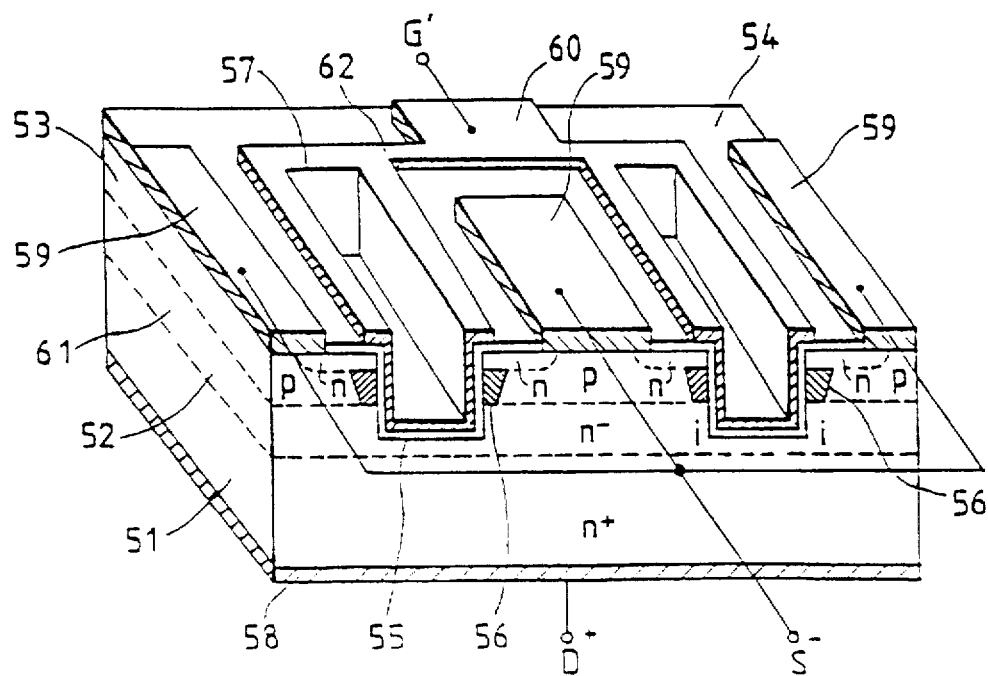

FIG. 12 is a top view showing the outline of the constitution of a power IC provided with the field-effect transistor of the present invention.

In FIG. 12, numeral 18 represents the field-effect transistor of the present invention and 19 represents an integrated circuit for controlling the field-effect transistor 18, and like components in FIG. 1 have like reference numerals.

The field-effect transistor 18 serving as a main current control device is fabricated on part of the main surface 13 of the hexagonal-system single-crystal silicon carbide wafer 1, and the IC 19 for controlling the field-effect transistor 18 is fabricated on other part of the single-crystal wafer 1.

According to the above arrangement, it is possible to efficiency fabricate the field-effect transistor 18 and IC 19 on the single-crystal wafer 1.

As described above, the present invention has an advantage that it is possible to substantially decrease the leakage current between the source and the drain of a field-effect transistor made of hexagonal-system single-crystal silicon carbide when the gate voltage of the field-effect transistor is turned off compared to that of a known field-effect transistor of this type and obtain a field-effect transistor with a high reliability. Moreover, the present invention has an advantage that it is possible to substantially decrease the electrical resistance between the source and the drain of the field-effect transistor when the gate voltage of the field-effect transistor is turned on compared to that of the known field-effect transistor of this type. Therefore, the present invention makes it possible to greatly increase the power conversion capacity of the field-effect transistor made of hexagonal-system single-crystal silicon carbide compared to that of the known field-effect transistor of this type.

What is claimed is:

1. A semiconductor device provided with current terminals on opposite surfaces of a flat hexagonal-system single-crystal silicon carbide, wherein a crystallographic <0001> direction of the single-crystal silicon carbide is parallel with a surface and a controlled current path is parallel with a crystallographic {0001} plane of the single-crystal silicon carbide.

2. A semiconductor device provided with current terminals on opposite surfaces of a hexagonal-system single-crystal silicon carbide layer epitaxially grown on a substrate, wherein a crystallographic <0001> direction of the single-crystal silicon carbide is parallel with a surface and a controlled current path is parallel with a crystallographic {0001} plane of the single-crystal silicon carbide.

3. A transistor provided with current terminals on opposite surfaces of a hexagonal-system single-crystal silicon carbide layer epitaxially grown on a substrate, wherein a crystallographic <0001> direction of the single-crystal silicon carbide is parallel with a surface and a controlled current path is parallel with a crystallographic {0001} plane of the single-crystal silicon carbide.

4. A field-effect transistor comprising a first region of n-type hexagonal-system silicon carbide formed on an n-type substrate, a second region of p-type hexagonal-system silicon carbide formed on a surface of the first silicon carbide region, a third region of n-type hexagonal-system silicon carbide formed on part of a surface of the second silicon carbide region, a gate insulating film covering the surface of the second silicon carbide region, a gate electrode formed on the gate insulating film, a source electrode formed on the third silicon carbide region, and a drain electrode formed on a back of the substrate, wherein all the silicon carbide regions are epitaxially grown so that the crystallographic <0001> directions are parallel with a substrate surface and a current path between the source and drain electrodes is parallel with a crystallographic {0001} plane of the silicon carbide.

5. A field-effect transistor comprising a first region of n-type hexagonal-system silicon carbide formed on an n-type substrate, a second region of p-type hexagonal-system silicon carbide superimposed on the first hexagonal-system silicon carbide region, a third region of n-type hexagonal-system silicon carbide formed on a surface of the second silicon carbide region, a groove extending to the first silicon carbide region through the third silicon carbide region, a gate insulating film covering a surface of the groove, a gate electrode formed in the groove through the gate insulating film, a source electrode formed on the third silicon carbide region, and a drain electrode formed on a back of the substrate, wherein all the silicon carbide regions are epitaxially grown so that the crystallographic <0001> directions are parallel with a substrate surface and a current path between the source and drain electrodes is parallel with a crystallographic {0001} plane of the silicon carbide.

6. The field-effect transistor according to claim 4 or 5, wherein a channel forming plane is parallel with a crystallographic {11$\underline{2}$0} plane of the silicon carbide.

7. A field-effect transistor comprising a first region of n-type hexagonal-system silicon carbide formed on an n-type substrate, a second region of p-type hexagonal-system silicon carbide formed on a surface of the first silicon carbide region, a source electrode formed on the first silicon carbide region, a gate electrode formed on the second silicon carbide region, and a drain electrode formed on a back of the substrate, wherein all the silicon carbide regions are epitaxially grown so that the crystallographic <0001> directions are parallel with a substrate surface and a current path between the source and drain electrodes is parallel with a crystallographic {0001} plane.

8. A field-effect transistor comprising a first region of n-type hexagonal-system silicon carbide formed on an n-type substrate, a second region of p-type hexagonal-system silicon carbide superimposed on the first hexagonal-system silicon carbide, a third region of $p^+$-type hexagonal-system silicon carbide with a carrier density higher than that of the second silicon carbide region, said third region extending to the first silicon carbide region from a surface of the second silicon carbide region, a fourth region of n-type silicon carbide formed on part of the surface of the second silicon carbide region, a source electrode formed on the fourth silicon carbide region, a drain electrode formed on a back of the substrate, and a gate electrode formed on the third silicon carbide region, wherein all the silicon carbide regions are epitaxially grown so that the crystallographic <0001> directions are parallel with a [the]substrate surface and a current path between the source and drain electrodes is parallel with a crystallographic {0001} plane.

9. A Schottky junction diode comprising a region made of hexagonal-system silicon carbide of a first conductivity type formed on a substrate of a first conductivity type, an electrode forming a Schottky junction with a silicon carbide layer formed on the silicon carbide, and an electrode formed on a back of the substrate to form an ohmic contact with the substrate, wherein the silicon carbide layer is epitaxially grown so that a crystallographic <0001> direction is parallel with the support surface and a current path between the Schottky and ohmic electrodes is parallel with a crystallographic {0001} plane of the silicon carbide layer.

10. A pn junction diode comprising a first region made of hexagonal-system silicon carbide of a first conductivity type formed on a substrate of the first conductivity type, a second region made of hexagonal-system silicon carbide of a second conductivity type superimposed on the first hexagonal-system silicon carbide, an electrode formed on the second silicon carbide, and an electrode formed on a back of the substrate, wherein the first and second silicon carbide regions are epitaxially grown so that a crystallographic <0001> directions are parallel with a support surface and a current path between the electrode formed on the second silicon carbide and the electrode formed on the back of the substrate is parallel with crystallographic {0001} planes of the first and second silicon carbide regions.

11. A thyristor comprising a first region made of hexagonal-system silicon carbide of a first conductivity type formed on a substrate of the first conductivity type, a second region made of hexagonal-system silicon carbide of a second conductivity type superimposed on the first hexagonal-system silicon carbide, a third region made of hexagonal-system silicon carbide of the first conductivity type formed on the second silicon carbide, a fourth region made of hexagonal-system silicon carbide of the second conductivity type formed on the third silicon carbide, a cathode electrode formed on the fourth silicon carbide, and an anode electrode formed on a back of the substrate, wherein all of the first to fourth silicon carbide regions are epitaxially grown so that a crystallographic <0001> directions are parallel with a support surface and the current path between the cathode and anode electrodes is parallel with the crystallographic {0001} directions of the first to fourth silicon carbide regions.

12. A thyristor comprising a first region made of hexagonal-system silicon carbide of a first conductivity type formed on a substrate of the first conductivity type, a second region made of hexagonal-system silicon carbide of a second conductivity type superimposed on the first hexagonal-system silicon carbide, a third region made of hexagonal-system silicon carbide formed on the second silicon carbide of the first conductivity type, a fourth region made of hexagonal-system silicon carbide of the second conductivity type formed on the third silicon carbide or a surface of the third silicon carbide, a cathode electrode formed on the fourth silicon carbide, a gate electrode formed on the third silicon carbide, and an anode electrode formed on a back of the substrate, wherein the first to fourth silicon carbide regions are epitaxially grown so that crystallographic <0001> directions are parallel with the substrate surface and a current path between the cathode and anode electrodes is parallel with crystallographic {0001} planes.

13. A power converter of a power conversion capacity of 1,000 kVA or more, which includes any of the semiconductor device, field-effect transistor, and thyristor according to any of claims 1 to 8, 11, 12 or 6.

14. A motor driving inverter for use in a power conversion capacity range of 100 to 10,000 kVA, which includes any of the semiconductor device, field- effect transistor, and thyristor according to any of claims 1 to 8, 11, 12 or 6.

* * * * *